United States Patent [19]

Glassco

[11] Patent Number: 4,673,057

[45] Date of Patent: Jun. 16, 1987

[54] GEOMETRICAL TRANSDUCER ARRANGEMENTS

[76] Inventor: John M. Glassco, P.O. Box 651, Soap Lake, Wash. 98851

[21] Appl. No.: 671,099

[22] Filed: Nov. 13, 1984

[51] Int. Cl.[4] ............................................ H05K 5/00

[52] U.S. Cl. .................................. 181/144; 181/147; 181/150; 181/152; 181/153; 181/199

[58] Field of Search .............. 181/144, 150, 152, 147, 181/153, 175, 199; 179/146 E

[56] References Cited

U.S. PATENT DOCUMENTS

| | | | |
|---|---|---|---|
| 2,275,610 | 3/1942 | Bucky et al. | 179/146 E X |
| 2,710,662 | 6/1955 | Camogs | 181/145 |
| 3,435,910 | 4/1969 | Lahti | 181/152 |
| 3,759,345 | 9/1973 | Borisenko | 181/145 |
| 3,933,219 | 1/1976 | Butler | 181/144 |
| 4,051,919 | 10/1977 | Buettner | 181/144 |
| 4,063,614 | 12/1977 | Iven | 181/199 X |
| 4,231,446 | 11/1980 | Weiss et al. | 181/199 X |
| 4,268,719 | 5/1981 | Manger | 181/144 X |
| 4,299,304 | 11/1981 | Rebsch | 181/144 |
| 4,437,540 | 3/1984 | Murakami et al. | 181/150 X |

*Primary Examiner*—Benjamin R. Fuller

[57] ABSTRACT

High quality single or multiple channel sound dispersal is obtained through the arrangement of a plurality of similar speakers divergently mounted in an airtight frame with integral horns formed therein such that the central axis of each speaker is coaxial with a line normal to and projected from the center of each face of a polyhedron characterized by the tetrahedron, the hexahedron, the octahedron, the dodecahedron and the icosahedron. When the speakers thus arranged are excited in phase, a series of infinite acoustic baffles are created between adjacent speakers creating a series of exponential horns which disperse the sound energy as if from a point source to the walls, ceiling and floor of the listening room and then by reflection to the listener. The frame/horn component is manufactured of universal parts.

17 Claims, 13 Drawing Figures

GEOMETRICAL TRANSDUCER ARRANGEMENTS

BACKGROUND OF THE INVENTION AND PRIOR ART

The present invention relates to sound reproduction and more specifically to plural speakers compactly and divergently arranged to disperse sound generally equally in all directions.

Most examples of prior art reveal dual cabinets possibly containing multiple speakers located a distance apart at one end of the listening room on a baseline. This common arrangement is very directional and provides a line bisecting and normal to said baseline along which the listener must be positioned and at a proper distance from the arrangement in order to hear the sound from both cabinets in properly balanced relation.

Many attempts have been made to provide the listener with a larger listening area from which to hear properly balanced sound such as U.S. Pats. No. 2,710,662 to Camras and 3,933,219 to Butter both of which provide a unitary cabinet designed to direct the sound energy emanating from the speakers towards the rear wall of the listening room this sound energy being subsequently reflected off the side walls of the room toward the listener artifically separating the apparent source of sound beyond the walls of the room thereby creating an enlarged area of properly balanced sound energy. Another approach as set forth in U.S. Pat. No. 3,759,345 to Borisenko utilizes dual cabinets positioned in a conventional way but containing acoustic focusers which tend to direct the sound energy emanating from each speaker to the opposite side of the room such that a transverse shifting of the listener toward one side or the other maintains a more properly balanced distribution of sound from the two cabinets. These various solutions, although an improvement over their prior art, manipulate the sound escaping from their cabinets to direct said sound in a certain direction. Such manipulation involves certain distortions which the present invention seeks to reduce while retaining the advantage of an enlarged area of balanced listening from dual channel sound signal output.

In the art of sound reproduction besides the enhancement of stero separation many inventions are concerned with maximizing the qualit yof sound reproduced in a listening room. A speaker sealed into an infinite acoustic baffle is recognized as providing true and accurate sound reproduction through the elimination of interfering sound waves which inevitably emanate from the rear of a speaker. Such a baffle also eliminates the uncontrolled distortion of sound waves as they radiate outwardly from and collide with the edges and features of the conventional cabinet which is generally rectangular in shape. U.S. Pat. No. 4,268,719 to Manger demonstrates that the creation of this hitherto theoretical infinite acoustic baffle is possible simply by placing two similar speakers back to back and exciting said speakers in unison. The baffle is created along a common plane between the speakers thereby cancelling out interference from the rear of the speakers and enhancing the distributed sound measurably. According to the Manger patent, the effect is present even when said speakers are divergently aligned, as long as their central axes intersect at a common point.

The present invention places more than three speakers in divergent alignment about a common point such that said speakers share a common angle of divergence with all adjacent speakers. For instance, U.S. Pat. No. 4,268,719 is primarily concerned with two speakers mounted at an angle of divergence of 180 degrees. The improvement herein described places for example four similar speakers at a common angle of divergence of 109.47122 degrees between the axes of adjacent speakers thereby reproducing said infinite acoustic baffle as a series of flat planes radiating outwardly from the centre of the arrangement between adjacent speakers and thereby separating the output of said speakers one from another. As long as the angle of divergence between adjacent speakers is equal and said speakers are exicted in phase, this infinite acoustic baffle is created in the form of a regular geometric pyramid coaxial with each speaker and having an open and outwardly facing base said base being at an infinite distance from the centre of this arrangement.

Several examples of prior art such as U.S. Pat. No. 4,299,304 to Rebsch describe the advantage of an exponential horn when mounted coaxially with the output side of a speaker. In fact the Rebsch patent by placing the speaker coaxially with the cooperating plane surfaces in the corner of a room utilizes these surfaces to create an infinite horn that occupies one eighth of the volume of a sphere. The present invention can reproduce a similar condition by utilizing the principle of the infinite acoustic baffle to create said horm by placing eight speakers in balanced divergence about a common point. With eight speakers the common angle of divergence is 70.52878 degrees between the axes of adjacent speakers. Therefore the present invention can utilize the advantages of the exponential horn without having to resort to remote speaker placement such as that of U.S. Pat. No. 4,299,304 or additional construction of any king.

BRIEF SUMMARY OF THE INVENTION

The present invention provides a novel arrangement of electroacoustic transducers which finds considerable utility as a loudspeaker. The arrangement includes a pluarlity of similar speakers mounted divergently in a framework which approximates the shape of a polyhedron which could be a tetrahedron, a hexehedron, an octahedron, a dodecahedron or an icosahedron. This framework fixes a speaker in the centre of each face of this polyhedron. With speakers mounted in this way with their axes diverging from a point at the centre of this polyhedron, and with this arrangement mounted suspended in a listening room, and with all speakers excited in phase, a planar infinite acoustic barrier is created radiating outward between all adjacent speakers creating also a radiating network of planar acoustic barriers which take the form of a series of exponential horns each of which has a speaker located at its throat. This provides an ideal condition for the design of a loudspeaker due to the minimum reflective discontinuity of such exponential horns. Because the speaker arrangement is truly omnidirectional and suspended in the listening room instead of the prior art arrangement of placing the cabinet on or close to the floor, previously much neglected surfaces of the ceiling and floor of the listening room are utilized for reflecting sound and broadcasting acoustic information to a listener located therein.

Another aspect of the invention concerns the use of input transducers. An assembly of such transducers arranged in this new manner should also have utility as an omnidirectional microphone of high quality.

A further embodiment of the present invention is to provide a series of horn members respectively attached to each speaker which have the effect of smoothly directing the sound energy from each speaker to the series of ideal exponential horns. These horn members may contain integrally formed grille covers to protect the delicate internal speaker parts from accidental damage. In all cases, alternate grille cover members of metal mesh or a mesh/cloth combination or the like to be manufactured as a separate part, can be included to be fastened to the front of each speaker.

It is another object of the present invention to provide an airtight membrane surrounding the assembly with apertures arranged on its surface with the speakers sealed therein to provide an airtight space such that extraneous vibrations emanating from the rear of each speaker is prevented from escaping and reducing the quality of sound produced.

The aforementioned frame members, horn members and airtight membrane may be incorporated into a single universal part called for the purpose of this dissertation of horn/frame member. This horn/frame member is provided with an outline that corresponds with that of the regular face of the polyhedron which defines the shape of its corresponding cabinet. The horn/frame member is also provided with side edges bevelled to ensure proper alignment with adjacent horn/frame members which are combined to form the entire speaker cabinet, possibly with a specially formed compressable gasket sandwiched between adjacent horn/frame members to ensure an airtight seal.

Another feature of this horn/frame member is an internally formed slot located at the midpoint of each bevelled face of the member and oriented parallel to this face. This slot is provided to receive a hanger consisting of an L shaped section of metal the shorter arm of which is inserted into the slot with the longer arm pointing outwardly and this outer arm being equipped with a hole at its extremity. When any two nearest adjacent slots are thus equipped with these hangers and the entire cabinet is assembled according to the invention, these hangers are trapped in their respective positions to provide two points of attachment for suspending the unit using chain or cable like suspension members attached thereto and subsequently to two hooks installed in the ceiling of the listening room on a line bisecting this ceiling. In the case of an octahedral form of the invention, opposite adjacent sides should be employed instead of nearest adjacent sides to be equipped with the hangers to provide an improved orientation for this type of arrangement.

Another object of the invention provides a partial channel formed as part of the bevelled face of each side of the horn/frame member used to direct signal input wires into the airtight cabinet. The channel does not interrupt the airtight seal against which it is located until a bridge of material is removed at the required location to allow input wires to pass through.

Another object of the invention provides ports located between the speakers at the vertices of the polyhedrons. Because of the varieties and characteristics of available speakers it may be necessary to adjust the internal pressure inside the airtight space by introducing such regular pattern of ports. Alternatively the internal airtight space may be packed with fiberglass or some other material in order to increase the internal pressure.

Also additional speakers of smaller size may be introduced at the vertices of the polyhedron where such space allows in the position of the aforementioned ports.

Another aspect of the invention relates to passive drivers substituted for some of the speakers in the assembly in order to reduce costs of manufacture or to modify the sound distribution qualities of the assembly.

Multi-channel sound reproduction is possible by dividing the arrangement into appropriate portions. Bisecting the transducer arrangement with an equatorial plane through the midpoints of any two nearest adjacent sides of the polyhedron, an equal division takes place for stero sound reproduction. If the arrangement is suspended from those two adjacent sides at their midpoints the assembly will hange in space with the equatorial plane hanging vertically and with equal numbers of speakers on each side of this plane and each speaker being aligned divergently from this plane. If two sound channels are used to excite each half of the assembly, and the assembly is located with the equatorial plane hanging vertically bisecting a listening room, then excellent stereo sound reproduction is enjoyed over an area which is larger than that of a comparable prior art arrangement.

This further object of the invention provides for a wall mounted bracket and a floor or table stand from which to suspend the arrangement where ceiling mounting is not desirable or practical.

A speaker located on nay face of the assembly may be removed and replaced with a configuration of smaller speakers roughly in the same plane as the removed speaker with suitably adaped horn/frame member to accomodate this furhter object of the invention.

A yet further object of the invention provides for the removal of one or more speakers in order to create additional port areas, external control panels, lights, or a place at which to afix a rigid mounting means or some other reason.

These and other objects and advantages of the present invention reside in the details of construction and operation and will appear hereinafter, reference being had to the accompanying drawings.

DETAILED DESCRIPTION

Figure 1:
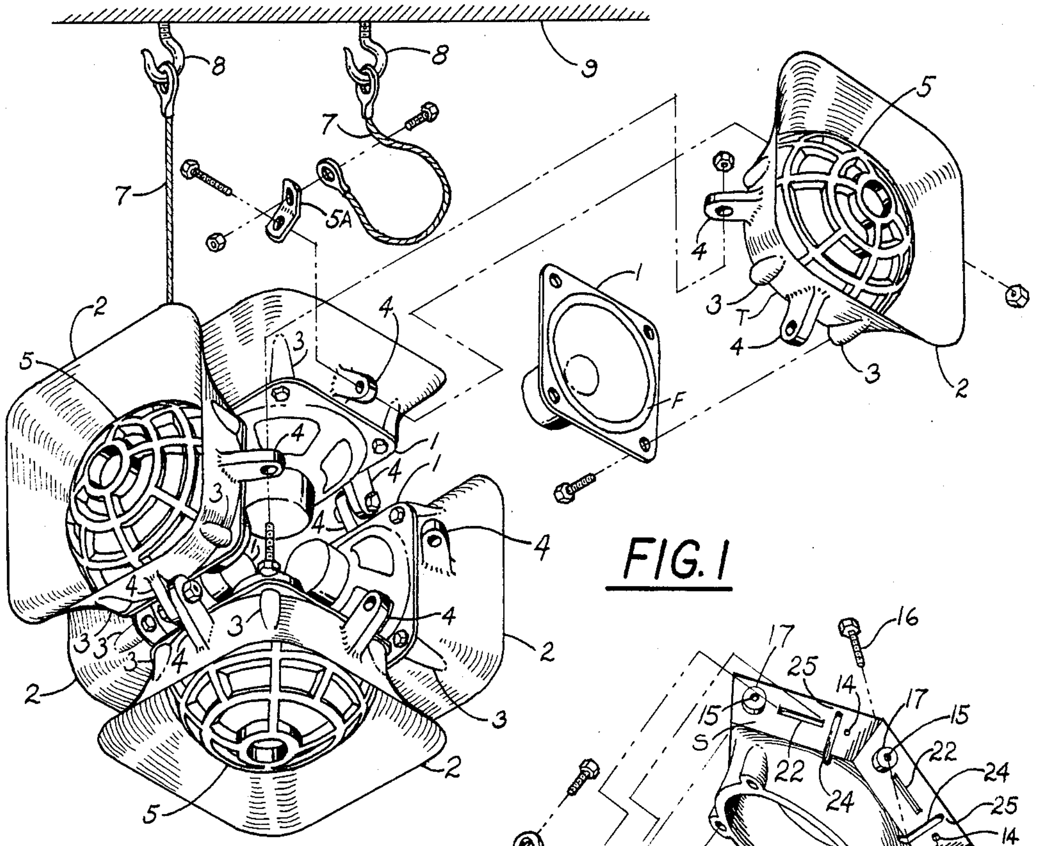
FIG. 1 is a partially exploded elevational view of the assembly.

Reference is now made to the drawings and in particular to FIG. 1 wherein there is illustrated a preferred embodiment of the present invention which includes a series of similar horns 2 said horns having a peripheral rear surface T with mounting lugs 3 formed as a integral part thereof. The assembly also includes a series of speakers 1 each said speaker having a central axis (not shown) and a peripheral front surface F of size and shape, in this case circular, to correspond with respective horn members 2. Each speaker is disposed with its mounting surface or peripheral front surface F abutting the planar rear surface T of a respective horn 2 said speaker being attached at said mounting lugs 3 provided by screws or other fasteners. This particular embodiment includes speaker grille covers 5 formed as integral parts with the horn members 2, said grille covers provided for the protection of the delicate parts of the speakers thereto attached. Said speakers are oriented and positioned with their central axes divergently aligned and equidistant from a point described as the centre of a polyhedron such that said central axis of each said speaker is coaxial with a line normal to and projected from the centre of each face of said polyhedron such that each said central axis diverges from each adjacent central axis at a common angle of divergence A. Therefore the number of speakers and said angle of divergence A will depend on the particular polyhedron selected as a baic form for each arrangement thus the tetrahedral form employs four speakers having an angle A of 109.47122 degrees with one another, the hexahedral form employs six speakers having an angle A of 90 degrees, the octahedral form employs eight speakers having a angle A of 70.52878 degrees, the dodecahedral form employs twelve speakers having an angle A of 63.43494 degrees and the icosahedral form employs twenty speakers having an angle A of 41.81031 degrees. Therefore the embodiment of FIG. 1 employing six speakers contains mounting or attaching means to orient these six speakers at a common angle of divergence of 90 degrees according to the requirements of said hexahedral form which is the basis for the arrangement of FIG. 1. Said mounting or attaching means consists of four attachment members such as rectangular tabs 4 equispaced about the perimeter towards the rear surface T of each said horn member 2 and projecting outwardly therefrom and formed integrally with said horn members, said tabs being provided with holes at their outer ends, the axis of said holes being perpendicular to said central axis of said speaker 1 as mounted to said horn member 2.

Each said tab 4 is attached to those of adjacent horn members 2 using bolts thus forming the assembly as illustrated. The tabs 4 are positioned displaced slightly along a line parallel to the axis of their respective holes in a common direction to ensure proper alignment of the horns one to another.

Two hangers 5A consisting of flat metal members each being equipped with two holes at their opposite respective extremities are provided bolted to two respective adjacent tabs 4 of any horn member 2 during the assembly thereof using one respective hole of each for this purpose. The opposite extremity of each respective hanger is bent slightly to orient these pieces outwardly from the centre of the assembly. Two linear suspension members 7 each having loops at their respective ends are bolted to the respective hangers using their available respective holes. The respective loops at the opposite respective ends of said suspension members 7 are installed into the ceiling 9 of the listening room from hooks said hooks being positioned at a distance apart which corresponds to the distance between adjacent tabs 4 on the horn member 2 to which said hangers 5 are bolted.

Figure 2:
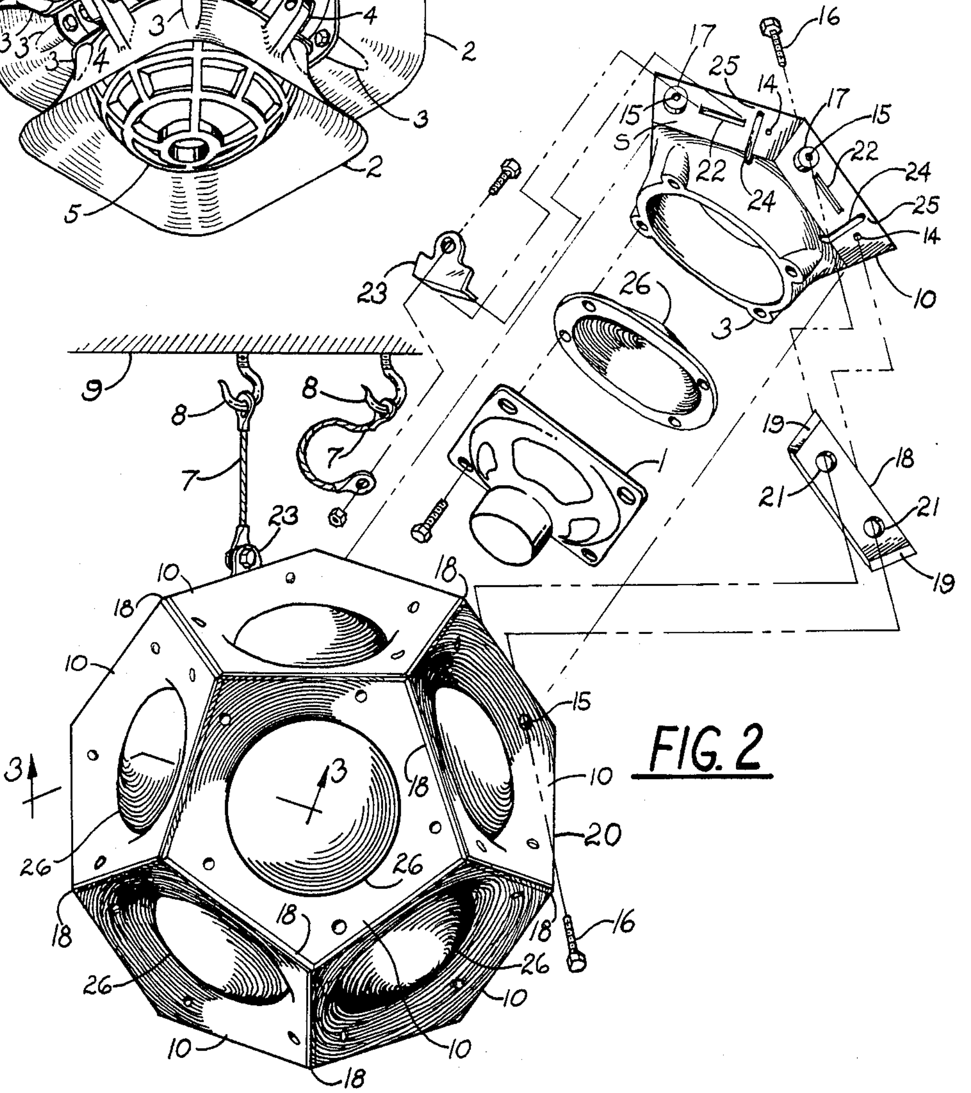
FIG. 2 is a partially exploded elevational view of an airtight embodiment of the invention.

Referring now to FIG. 2 thereis shown an assembly according to the invention based on the form of said dodecahedron and containing twelve speakers said speakers having a common angle of divergence of 63.43494 degrees said assembly incorporating frame members, horn members and an airtight membrane into and formed as a single universal part referred to in this dissertation as a horn/frame member 10. In this instance, horn/frame member 10 is provided with an outline that corresponds with the shape of each face of said dodecahedron i.e. the pentagon. The edges of said horn frame member 10 are provided with a bevelled surface S to ensure proper alignment with adjacent horn/frame members. Said bevelled surface S is inclined at angle B which is defined as the angle in degrees included between the face of said polyhedron and the bevelled surface R and is equal to $$B=(180-A/2)$$

where A is the included angle between the axes of adjacent speakers. In this assembly the angle B is 58.28253 degrees. Each said horn/frame member 10 is provided with a blind assembly hole 14 centered on and normal to one end of each said bevelled surface S to receive assembly screw 16. Centered on the opposite end of each said surface S is provided an assembly hole 15 normal to said surface S and passing through said horn/frame member 10 to the front face thereof where is provided a coaxial socket to allow the head of assembly screw 16 to be hidden therein in the final assembled form of theunit. Each said hole is provided with a cylindrical spacer member 17 coaxial with each said hole 15 and formed integrally as part of said horn/frame member 10 and located in relation to each said surface such that when adjacent horn/frame members 10 are assembled and screwed together according to the invention, said spacer member 17 ensures that the proper gap is maintained therebetween to prevent overcompression of gasket member 18 which is provided to form an airtight seal between all adjacent bevelled surface 8. Each said gasket member 18 is sized and shaped to correspond with said bevelled surface S and is provided with bevelled ends 19 to ensure a complete airtight seal where it abutts two adjacent gasket members 18 at each end thereof 19 in its position in the assembled unit 20. This gasket member 18 is further provided two holes 21 which correspond with the position of assembly holes 14 and 15 and are sized to accommodate said spacer member 17. Each said bevelled surface S is further provided an integrally formed rectangular slot 22 located at the midpoint of said bevelled surface S and oriented parallel to said surface and projected normally to a depth into said surface to receive the shorter arm of metal hanger 23 said hanger being of L shaped section with its long arm being oriented outward and said longer arm being provided with a hole for hanging the assembled unit 20 therefrom. When two adjacent horn/-frame members 10 are assembled and screwed together according to the invention with said hanger 23 located in slot 22 of one said member 10 and with said gasket 18 included therebetween, said hanger 23 is trapped and fixed in position and embedded in gasket 18 so as not to interfere in the alignment or the airtight seal provided. Adjacent to slot 22 in each bevelled surface S and formed integrally with horn/frame member 10 is provided a channel 24 sized and shaped to direct signal wires into the airtight space of the assembly for the operation of speakers contained therein. Said channel 24 is further provided with an integrally formed bridge 25 closing off said channel at the exterior surface of said horn/frame member in order to preserve the airtight seal and to ensure an attractive appearance of the assembled unit. Said bridge 25 is removed at that point where said signal wires must pass through the assembly for the proper function thereof.

In the embodiment shown in FIG. 2 each speaker 1 is provided a grille cover 26 which is dome-shaped and constructed of metal mesh covered with an acoustically transparent fabric or expanded foam material for the protection of the delicate speaker parts located therebehind said cover having a flexible gasket attached thereto to size and shape to conform to the said opening of the planar rear surface of horn/frame member 10 and having holes in this gasket provided to correspond with the mounting holes located in said horn/frame member for the attachment thereto of said speakers 1 at its peripheral front surface F said grille cover being trapped therebetween in its correct position.

Said speakers 1 are provided and attached with said grille covers to said horn/frame members 10 positioned with their bevelled surfaces in mutual adjacent relation with said gasket members 18 trapped therebetween and two said hangers 23 provided fixed in position in two adjacent slots 22 of an upper facing horn/frame member selected for this purpose, said horn/frame members are screwed and fixed in place one to another using mounting screws 16 in all placed provided.

Employing two suspension members 7 bolted to two respective hangers 23 protruding through the surface of said assembled unit 20 and attached to two respective hooks 8 provided in the ceiling of said listening room 9 at a distance apart equal to that of said hanger located as part of said assembled unit 20 enables the operation of the assembly according to the invention.

Figure 3:
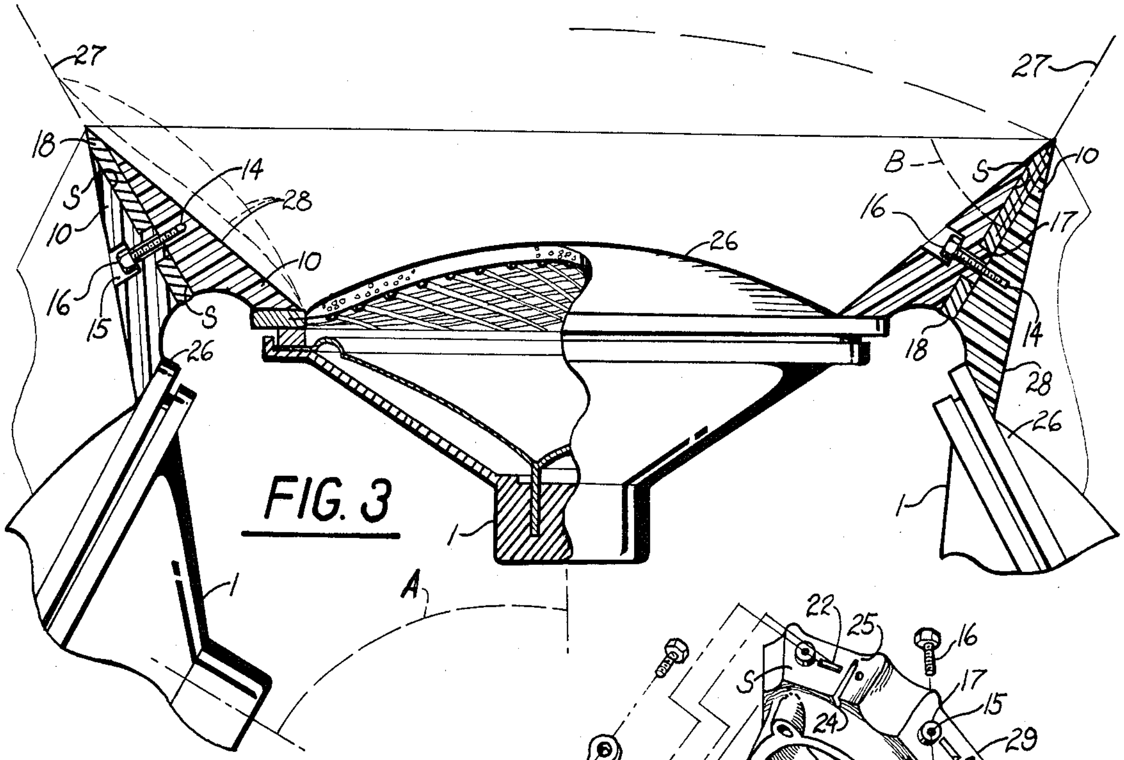
FIG. 3 is a typical cross sectional view of the assembly taken along the line 3—3 of FIG. 2.

The sectional view of FIG. 3 through the assembly of FIG. 2 illustrates the profile of said horn/frame member 10 directing the sound energy from the speaker outward into the mouth of said exponential horn defined by the infinite acoustic barrier 27 projected outwardly between adjacent speakers 1 said speakers being excited in phase. The profile of the exponential horn is fixed by the geometry of the arrangement of speakers. In the case illustrated in FIG. 2, the profile is pentagonal and the expansion rate is determined by its occupation of one twelfth of a sphere. Each configuration of speakers according to the invention will impart its own particular characteristics to said exponential horn. The profile of the horn 28 contained within said horn/frame member 10 directs the sound energy into the throat of the exponential horn. Because the speaker unit as shown in FIG. 2 is intended for domestic use and could be hung overhead in a listening room of conventional height, long horns would interfere with the use thereof and would be impractical, thus, the profile of horn 28 creates a rather abrupt transition. If the unit is designed intended for commercial use such as a stadium or a church, much more flexibility in the design of the horn is possible due to the increased space allowable for horn structures. In the case of the unit of FIG. 2, if round speakers of 4 inch diameter are selected for incorporation therewithin, and said speakers are placed as compactly as possible according to the invention and noninterferingly located, the centers of the peripheral front surfaces of opposing speakers are separated by a distance of approximately 8 inches depending on the specific dimensions of the features of these speakers such as the magnets, mounting lugs, etc. Adding a horn of two inches in length to each speaker an effective diameter of the assembly of approximately 12 inches which is of appropriate size for domestic use.

Incidental to the discussion of horns but of overall interest, such a unit divided into stero would provide an area of diaphragm roughly equal to that of a 10 inch speaker provided on each channel of a conventional speaker system. the profile of the horn 28 as illustrated in FIG. 3 directs the sound energy outwardly from the speaker and smoothly directs said sound energy into the exponential horn with a minimum of reflective discontinuity which may be caused by abrupt changes in the rate of expansion of the vibrating air column. The profile of this horn is a straight line imparting a steady expansion rate to said air column up to the mouth of said horn 28 whereupon the throat of said exponential horn beings. A profile in the form of a broad S curve may smooth this transition somewhat and offer advantages of sound quality. The depiction of FIG. 3 also illustrates other details such as the structural profile of said horn/-frame member 10 showing the spacer member 17 and the gasket member 18.

Figure 4:
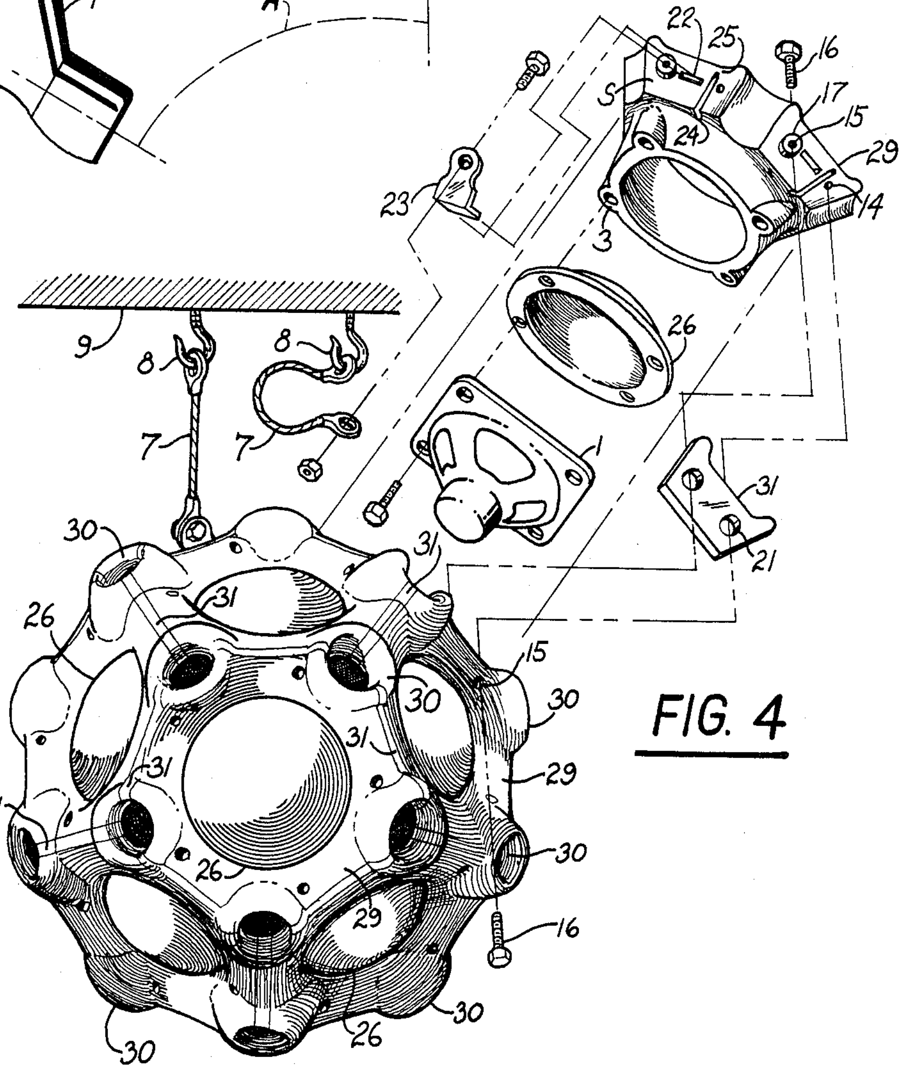
FIG. 4 is a partially exploded elevational view of an airtight embodiment of the invention incorporating ports formed integrally with the horn/frame members.

FIG. 4 illustrates an additional design which is similar to that of FIG. 2 in form and construction except that the horn frame members 29 have been modified to include a series of ports 30 located at the vertices of said polyhedron passing through the said airtight membrane. Given the characteristics of the speakers incorporated into the unit, internal pressure may limit the response of the diaphragms of said speakers as they vibrate in their relative positions. By introducing ports the overall quality of sound may be improved although the integrity of the said exponential horn is somewhat reduced. The optimum location of said ports is at the vertices of said polyhedron because the space between adjacent speakers is greatest at these locations. The gasket members 31 have been modified in this design to allow for the addition of the ports 30. Should the assembly require higher internal presure or should the action of the diaphragms require damping or if extraneous internal acoustic interference need be reduced, the internal airtight cavity may be packed with acoustic fiberglass or expanded foam or some other elastic or inelastic material.

Figure 5:
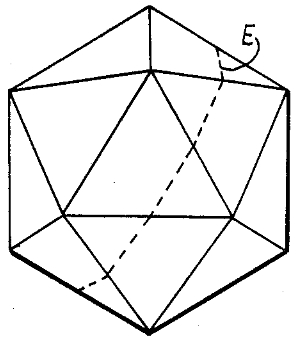
FIG. 5 is a perspective view of the icosahedron with an equatorial plane shown dashed where it intersects the surface thereof.
Figure 6:
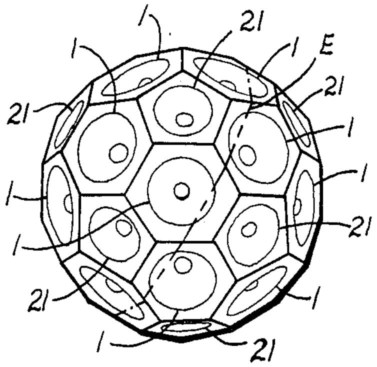
FIG. 6 is a perspective view of an embodiment of the invention based on the form of FIG. 5 and having truncated vertices with a number of smaller speakers with the central axes thereof located centrally onthe plane of truncation and having an equatorial plane shown dashed and corresponding to that of FIG. 5.

Under certain conditions a large public address system may require a speaker assembly of large size and high output. FIG. 5 illustrates the polyhedron known as the icosahedron, this polyhedron has 20 faces and therefore could be provided with 20 speakers according to the invention. A further 12 speakers of a slightly smaller size could be provided at the vertices of this form if said vertices were truncated as illustrated in FIG. 6. The output from the smaller speakers being equal one to another should be carefully balanced with the output from said larger speakers in order to maximize the output of the entire assembly. All of the polyhedra may be so modified to accommodate additional speakers or ports therein depending on the requirements of the application.

In the interests of reducing costs or of modifying the sound produced by the assembly according to the invention, a number of the speakers may be removed and replaced with passive drivers said passive drivers having elastic diaphragms designed to resonate in unison with driven speakers. It must be understood that this form of modification may render the assembly unfit for stereophonic application.

Figure 7:
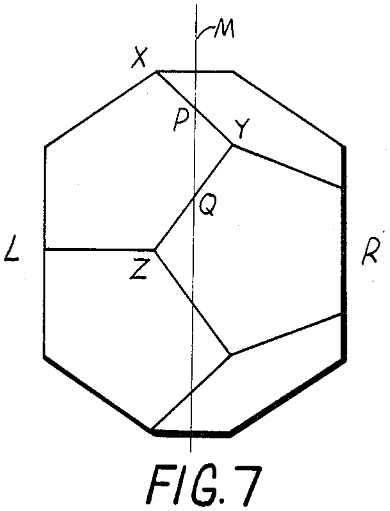
FIG. 7 is an elevational view of the assembly of FIG. 2 showing the location of the equatorial plane normal to the view.

Multichannel sound reproduction is achieved by dividing the assembly into equal divergent portions. In dual channel application an equatorial plane M in FIG. 7 is established which bisects the polyhedron, that is it passes through the centre. If this plane also passes through the midpoints of two nearest adjacent edges, it happens to bisect the polyhedron such that one half of the centres of the faces of this polyhedron will fall on either side of this plane M and all said lines projected from said centre points normal to said faces will diverge from the equatorial plane and if speakers installed in the configuration of said polyhedron are excited in accordance with the twoinput channels being designated left and right respectively, dual channel sound output divided by plane M is the result. If two nearest adjacent edges are used as points of suspension according to the invention and given that the unit contains similar parts, its mass is equally balanced on my plane passing through its centre including equatorial plane M and will hang suspended such that said equatorial plane will be found vertical. Further if the suspension hooks 8 are located on a line that bisects the ceiling of a listening room, said equatorial plane will bisect said listening room providing a broadcasting of dual channel sound to each half of said room respectively. Edges X,Y and Y,Z of FIG. 7 are nearest adjacent edges and their midpoints are points P and Q respectively. It can be seen that the dodecahedron illustrated is divided by plane M seen on edge such that left and right sides designated L and R respectively are defined by plane M passing through points P and Q.

Figure 8:
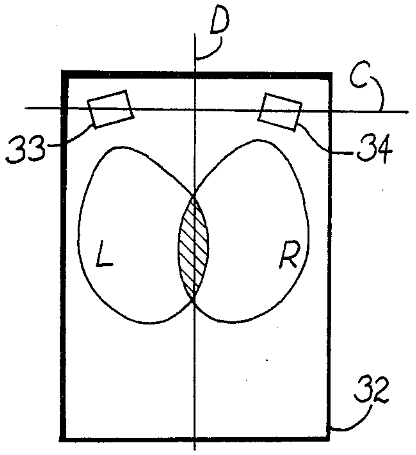
FIG. 8 is a plan view of a listening room showing prior art placement of speaker cabinets.
Figure 9:
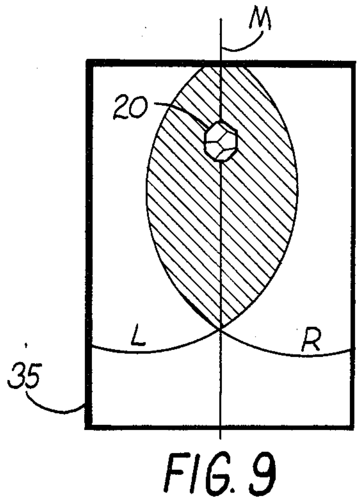
FIG. 9 is a plan view of a listening room showing the arrangement of the improved arrangement of FIG. 2 according to the invention.

FIG. 8 illustrates a listening room 32 according to prior art with two cabinets 33 and 34 said cabinets 33 and 34 being located on baseline C each containing speakers and being excited by left and right channels of a dual channel sound signal respectively. Two fields of influence from these cabinets designated L and R respectively show the area (hatched) in which the listener must be located to hear properly balanced sound emanating therefrom. The improved listening room 35 contains the improved speaker 20 as illustrated in FIG. 2 and located in the room such that equatorial plane M roughly bisects the room as shown. An aforementioned infinite acoustic baffle in the shape of an exponential horn emanates coaxially with each speaker and prevents the listener from hearing more than one speaker at a time. The majority of the sound that reaches the listener does so after being reflected off the walls, ceiling and floor of the listening room. This creates two fields of influence L and R in the illustration projected from the surfaces of the listening room and creating a much enlarged area shown hatched from which balanced sound can be heard as projected from the improved assembly 20.

Figure 10:
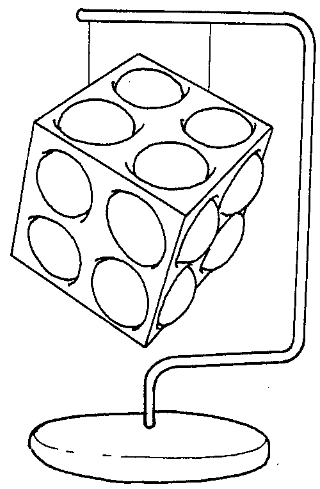
FIGS. 10 and 11 show embodiments for alternative mounting and standing the arrangement in a listening room according to the invention.

FIG. 10 shows an assembly based on the hexahedron suspended from a stand specially adapted to be placed on the floor or an item of furniture such as a shelf or table in the listening room. In this example each speaker has been replaced with a pattern of smaller speakers.

Figure 11:
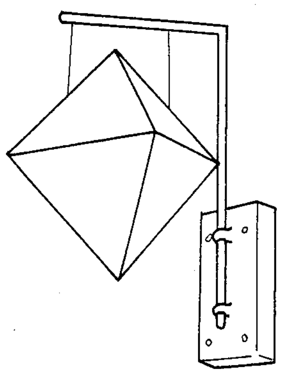

An assembly according to the invention and based on the octahedron is shown in FIG. 11 suspended from a wall mounted bracket adapted for that purpose.

Figure 12:
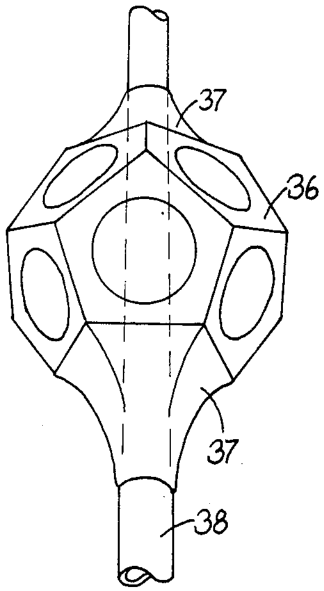
FIGS. 12 and 13 show further embodiments of an arrangement according to the invention.
Figure 13:
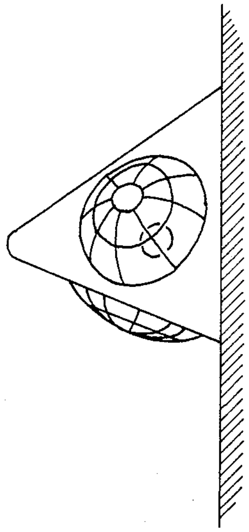

Under certain conditions it may be practical to remove one or more of the speakers from the assembly. This may be necessary to increase the port area or to provide special controls, etc. in the space provided. Removing a speaker should not completely nullify the advantages of the assembly if the orientation and position of the remaining speakers one to another is not disturbed. FIG. 12 illustrates such an example where an assembly 36 according to the invention has been adapted through the use of special mounting plates 37 for mounting on a pole 38 which passes through the body of the assembly as may be required for exterior public address application on a light pole or a sign pole. Another such example is shown in FIG. 13 where one face of a tetrahedral based unit 39 has been removed for flush mounting on a wall surface 40.

The invention is not limited to the exact form shown in the drawings as obvious changes may be made within the scope of the following claims.

I claim:

1. An arrangement of electroacoustic transducers comprising in combination, a plurality of similar electroacustic transducers each having a central axis normal to a substantially planar, peripheral front surface, an annular frame member for each transducer, having a planar rear surface conforming approximately to said peripheral front surface of each said transducer and having an annular opening therein sized and shaped to correspond with the peripheral outline of a respective said transducer, means mounting and securing each said transducer with the peripheral front surfaces thereof abutting said planar rear surface of a respective frame member, attaching means extending outwardly from the sides of each said frame member adjacent the rear surface thereof, for angular attachment of adjacently disposed frame members one to the other to form a polyhedron whereby said frames are situated to define the faces of said polyhedron, said attachment occurring at equispaced locations around the perimeter of each of said frames and coaxial with the central axis, said attachment means disposing the planes of said frames in an equal angular relationship with one another whereby adjacent axes of said frames and corresponding transducers diverge at an approximately equal angle from a central point, said transducers being excited in phase.

2. The device according to claim 1 wherein said arrangement employs six similar frames and corresponding transducers and wherein said attaching means consists of four attachment members for each frame situated at locations equispaced around the perimeter of said frame and wherein each plane of said frame S and said corresponding transducer is disposed in an approximate 90° angle with each of the adjacent said fram S and corresponding transducer, such that adjacent axes thereof diverge at an approximate angle of 90° from a central point.

3. The device according to claim 1 wherein said arrangement employs eight similar frames and corresponding transducers and wherein said attaching means consists of three attachment members for each frame situated at locations equispaced around the perimeter of said frame and wherein each plane of said frame and said corresponding transducer is disposed at an approximate 70.52878° angle with each of the adjacent said annular frames such that adjacent axes thereof diverge at an approximate angle of 109.47122° from the central point.

4. The device according to claim 1 wherein said arrangement employs twelve similar frames and corresponding transducers and wherein said attaching means consists of five attachment members situated at locations equispaced around the perimeter of said frame and wherein each plane of said frame and said corresponding transducer is disposed at an approximate 116.56506° angle with each of the adjacent said annular frames such that adjacent axes thereof diverge at an approximate angle of 63.43494° from the central point.

5. The device according to claim 1 wherein said arrangement employs twenty similar frames and corresponding transducers and wherein said attaching means consists of three attachment members situated at locations equispaced around the perimeter of said frame and wherein each plane of said frame and said corresponding transducer is disposed at an approximate 138.18969° angle with each of the adjacent said annular frames such that adjacent axes thereof diverge at an approximate angle of 41.81031° from the central point.

6. The device according to claim 1 in which each of said annular frame members is formed of an impervious material and is extended laterally to terminate in a series of cooperating boundary edge flanges, each said boundary edge flange engaging in adjacent boundary edge flange of an adjacent frame member at each respective attachment point, the plane of each of said cooperating edge flanges passing through said central point thereby forming an airtight enclosure.

7. The device according to claim 1 in which said annular opening is contoured to provide a horn member coaxial with said transducer and expanding outwardly therefrom to terminate in a mouth.

8. The device according to claim 6 in which said frame members are modified to include a number of additional similar transducers located coaxially with a series of imaginery lines projected outwardly from said central point and forming common angles with said adjacent central axes.

9. The device according to claim 1 in which said device is bisected by an equatorial plane passing through said central point, said equatorial plane also intersecting two adjacent attachment points thus separating said transducers into two groupings, namely left and right-hand groupings, such that the axes of each of said groupings respectively, generally diverge from said equatorial plane and further that when said device is located in a listening room, said equatorial plane approximately bisects said listening room vertically and said left and right hand respective groupings are excited from respective left and right hand stereo channel signals.

10. An arrangement of electroacoustic speakers comprising in combination a plurality of similar electroacoustic speakers each having a central axis and a peripheral front surface, means mounting and securing said speakers divergently aligned on each face and equidistant from a point defined as the centre of a polyhedron selected from the group consisting of a tetrahedron, a hexahedron, a octahedron, a dodecahedron, an icosahedron, such that said central axis of each said transducer is coaxial with a line normal to and projected from the centre of each face of said polyhedron, said mounting means forming an airtight space and also forming a series of horns integrally with said mounting means, said horns having planar rear surfaces abutting and attached to the peripheral front surfaces of the respective said speakers, said horns expanding therefrom and meeting and joining those of said horns in angular adjacent relation thereto, said meeting and joining occurring on a series of mutually divergent cooperating planes, said planes being coaxial with said central axes and passing through the edges of said polyhedron, said planes radiating from the centre of said polyhedron and means for supporting the arrangement in a fixed position within a listening room, said integral mounting means and horn assembly being constructed of a number of universal parts defined as frame members constituting part of said horns, each of which is manufactured of suitably formable material such as wood, metal and plastic, each said frame member having a central axis and being provided with a planar rear surface and an opening provided therein sized and shaped to correspond with the peripheral outline of said speakers, said opening being coaxial with said central axis, said frame members also having planar side surfaces angles such that when said frame member is superimposed or said polyhedron coaxial to said line normal to and projected from the centre of a face of the polyhedron, said planar side surfaces are parallel to and in close adjacent relation to said mutually divergent cooperating planes whereby said frame member is attached to a respective frame member with their respective planar side surfaces mutually abutting, a configuration of smaller speakers being substituted for each said speaker, said smaller speakers being noninterferingly arranged approximately coplanar to and confined by the edges of the respective face of said polyhedron, said frame members being modified to provide each said smaller speaker with a coaxial horn integrally formed therwith, the planar rear surface of each said horn abutting and attached to each said smaller speaker at its respective peripheral front surface.

11. The assembly of claim 10 in which a flexible and compressible planar gasket is added between adjacent planar side surfaces of all angular adjacent frame members to seal the assembly airtight.

12. The assembly of claim 10 in which an equatorial plane is established dividing the assembly into two halves, said equatorial plane passing through the midpoints of two nearest adjacent sides of said polyhedron except in the case of said octahedron in which said equatorial plane is located at the midpoints of two opposite adjacent upper sides thereof the transducers on one side of said plane being excited by one stero channel and the remaining transducers being excited by a second stereo channel, said mounting means being adapted such that said assembly is located in a fixed position in said listening room such that said equatorial plane roughly bisects said listening room vertically.

13. The assembly of claim 10 in which said frame members are modified to include ports located coaxially with lines projected from the centre of and through the vertices of said polyhedron.

14. The assembly of claim 10 in which one or more said speakers are replaced with passive drivers of similar size, said passive drivers provided with elastic mounted membranes to vibrate in unison with said remaining transducers.

15. The assembly of claim 10 in which said airtight space is packed with a sound absorbent material characterized by fiberglass, foam rubber and mineral wool.

16. The assembly of claim 10 in which said support means includes at least two hangers having an L-shaped section and having a hole in the respective long arms thereof, said frame member having slots provided in the palnar side surface thereof, said slots being at the appropriate midpoints thereof and parallel to said planar side surfaces and inclined normal to said planar surfaces, the short arms of said hangers, when respectively inserted into adjacent slots of two adjacent planar side surfaces of said frame member being trapped whereby to provide proper support for the assembly, flexible linear suspension members being attached to said holes and extending outward therefrom to terminate in two respective loops, hooks provided in the ceiling of said listening room, said hooks being positioned on a line that roughly bisects the ceiling of said listening room, said hooks being positioned the same distance apart as said holes and said hooks passing through said loops thusly fixing and suspending the assembly a suitable distance from the floor of said listening room.

17. The device according to claim 1 wherein said arrangement employs four similar frames and corresponding transducers and wherein said attaching means consists of three attachment members for each frame situated at locations equispaced around the perimter of said frames and wherein each plane of said frames and said corresponding transducer is disposed in an approximate 70.52878° angle with each of the adjacent said annular frames such that adjacent axes thereof diverge at an approximate angle of 109.47122° from the central point.

* * * * *